United States Patent
Britt et al.

(10) Patent No.: US 8,277,869 B2
(45) Date of Patent: Oct. 2, 2012

(54) HEATING FOR BUFFER LAYER DEPOSITION

(75) Inventors: Jeffrey S. Britt, Tucson, AZ (US); Scot Albright, Tucson, AZ (US); Urs Schoop, Tucson, AZ (US)

(73) Assignee: Global Solar Energy, Inc., Tucson, AZ (US)

( * ) Notice: Subject to any disclaimer, the term of this patent is extended or adjusted under 35 U.S.C. 154(b) by 657 days.

(21) Appl. No.: 12/397,873

(22) Filed: Mar. 4, 2009

(65) Prior Publication Data

US 2010/0086673 A1  Apr. 8, 2010

Related U.S. Application Data

(60) Provisional application No. 61/068,451, filed on Mar. 5, 2008.

(51) Int. Cl.
*C23C 16/52* (2006.01)
*B05D 5/12* (2006.01)

(52) U.S. Cl. .............. 427/8; 427/74; 427/177; 427/380; 427/426; 427/427

(58) Field of Classification Search ............... 427/8, 74, 427/177–178, 380, 426, 427
See application file for complete search history.

(56) References Cited

U.S. PATENT DOCUMENTS

| | | | |
|---|---|---|---|
| 3,148,084 A | 9/1964 | Hill et al. | |
| 4,143,235 A | 3/1979 | Duisman | |
| 4,204,933 A | 5/1980 | Barlow et al. | |
| 4,366,337 A | 12/1982 | Alessandrini et al. | |
| 4,642,140 A | 2/1987 | Noufi et al. | |
| 4,673,801 A * | 6/1987 | Leary et al. | 219/544 |
| 4,778,478 A | 10/1988 | Barnett | |
| 5,112,410 A | 5/1992 | Chen | |
| 5,578,502 A | 11/1996 | Albright et al. | |
| 6,109,912 A * | 8/2000 | Robinson et al. | 431/247 |
| 6,268,014 B1 | 7/2001 | Eberspacher et al. | |
| 6,281,098 B1 | 8/2001 | Wang et al. | |
| 6,310,281 B1 | 10/2001 | Wendt et al. | |
| 6,350,489 B1 | 2/2002 | Moriyama et al. | |
| 6,417,027 B1 | 7/2002 | Akram | |

(Continued)

FOREIGN PATENT DOCUMENTS

WO  WO 2005/086238  * 9/2005

OTHER PUBLICATIONS

The International Bureau of WIPO, International Search Report regarding PCT Application No. PCTUS09/01429 dated Jun. 17, 2009, 2 pgs.

(Continued)

*Primary Examiner* — James Lin
(74) *Attorney, Agent, or Firm* — Kolisch Hartwell, P.C.

(57) ABSTRACT

Improved methods and apparatus for forming thin film buffer layers of chalcogenide on a substrate web through the chemical combination of a metal and chalcogen in solution form. The web and/or the solutions may be heated by one or a plurality of heating elements that may be disposed out of physical contact with the web, allowing enhanced control over the reaction speed through fine temperature control. One or more properties of the chalcogenide layer may be measured, and the temperature of the system may be adjusted in response.

16 Claims, 2 Drawing Sheets

U.S. PATENT DOCUMENTS

| | | |
|---|---|---|
| 6,428,851 B1 | 8/2002 | Friedersdorf et al. |
| 6,537,845 B1 | 3/2003 | McCandless et al. |
| 7,393,516 B2 | 7/2008 | Seo et al. |
| 2003/0059526 A1 | 3/2003 | Benson et al. |
| 2003/0142169 A1* | 7/2003 | Maeng et al. ............ 347/47 |
| 2004/0067321 A1 | 4/2004 | Kondo et al. |
| 2005/0115502 A1 | 6/2005 | George et al. |
| 2005/0158909 A1 | 7/2005 | Milliron et al. |
| 2005/0278163 A1 | 12/2005 | Poplack et al. |
| 2006/0019333 A1 | 1/2006 | Rodgers et al. |
| 2006/0019427 A1 | 1/2006 | Cao |
| 2006/0062902 A1 | 3/2006 | Sager et al. |
| 2006/0096537 A1 | 5/2006 | Tuttle |
| 2007/0122936 A1 | 5/2007 | Park et al. |
| 2007/0169809 A1* | 7/2007 | Van Duren et al. ......... 136/262 |
| 2007/0243657 A1 | 10/2007 | Basol et al. |
| 2007/0253686 A1 | 11/2007 | Wendt et al. |
| 2008/0153268 A1 | 6/2008 | Johnston et al. |
| 2008/0175982 A1 | 7/2008 | Robinson et al. |
| 2008/0213467 A1 | 9/2008 | Yu et al. |
| 2008/0300323 A1 | 12/2008 | Caldwell et al. |
| 2009/0077805 A1 | 3/2009 | Bachrach et al. |

OTHER PUBLICATIONS

The International Bureau of WIPO, International Search Report regarding PCT Application No. PCTUS09/01427 dated Jun. 25, 2009, 2 pgs.

The International Bureau of WIPO, International Search Report regarding PCT Application No. PCTUS09/01432 dated Jun. 19, 2009, 2 pgs.

Tsui et al., "Techniques for Combinatorial Molecular Beam Epilaxy," Rev. Scl. Intr. vol. 76, Issue 6, Article 062206, May 18, 2005, 5pgs.

The International Bureau of WIPO, International Search Report regarding PCT Application No. PCT/US09/01428 dated Mar. 5, 2012, 2 pages.

The International Bureau of WIPO, Written Opinion of International Searching Authority regarding PCT Application No. PCT/US09/01428 dated Mar. 5, 2012, 11 pages.

* cited by examiner

HEATING FOR BUFFER LAYER DEPOSITION

CROSS-REFERENCE TO RELATED APPLICATION

This application claims priority under 35 U.S.C. §119 and applicable foreign and international law of U.S. Provisional Patent Application Ser. No. 61/068,451, filed on Mar. 5, 2008, which is hereby incorporated by reference in its entirety.

BACKGROUND

The field of photovoltaics generally relates to multi-layer materials that convert sunlight directly into DC electrical power. The basic mechanism for this conversion is the photovoltaic (or photoelectric) effect, first correctly described by Einstein in a seminal 1905 scientific paper for which he was awarded a Nobel Prize for physics. In the United States, photovoltaic (PV) devices are popularly known as solar cells. Solar cells are typically configured as a cooperating sandwich of p-type and n-type semiconductors, in which the n-type semiconductor material (on one "side" of the sandwich) exhibits an excess of electrons, and the p-type semiconductor material (on the other "side" of the sandwich) exhibits an excess of holes, each of which signifies the absence of an electron. Near the p-n junction between the two materials, valence electrons from the n-type layer move into neighboring holes in the p-type layer, creating a small electrical imbalance inside the solar cell. This results in an electric field in the vicinity of the junction.

When an incident photon excites an electron in the cell into the conduction band, the excited electron becomes unbound from the atoms of the semiconductor, creating a free electron/hole pair. Because, as described above, the p-n junction creates an electric field in the vicinity of the junction, electron/hole pairs created in this manner near the junction tend to separate and move away from junction, with the electron moving toward the n-type side, and the hole moving toward the p-type side of the junction. This creates an overall charge imbalance in the cell, so that if an external conductive path is provided between the two sides of the cell, electrons will move from the n-type side back to the p-type side along the external path, creating an electric current. In practice, electrons may be collected from at or near the surface of the n-type side by a conducting grid that covers a portion of the surface, while still allowing sufficient access into the cell by incident photons.

Such a photovoltaic structure, when appropriately located electrical contacts are included and the cell (or a series of cells) is incorporated into a closed electrical circuit, forms a working PV device. As a standalone device, a single conventional solar cell is not sufficient to power most applications. As a result, solar cells are commonly arranged into PV modules, or "strings," by connecting the front of one cell to the back of another, thereby adding the voltages of the individual cells together in electrical series. Typically, a significant number of cells are connected in series to achieve a usable voltage. The resulting DC current then may be fed through an inverter, where it is transformed into AC current at an appropriate frequency, which is chosen to match the frequency of AC current supplied by a conventional power grid. In the United States, this frequency is 60 Hertz (Hz), and most other countries provide AC power at either 50 Hz or 60 Hz.

One particular type of solar cell that has been developed for commercial use is a "thin film" PV cell. In comparison to other types of PV cells, such as crystalline silicon PV cells, thin film PV cells require less light-absorbing material to create a working cell, and thus can reduce processing costs. Thin film based PV cells also offer improved cost by employing previously developed deposition techniques widely used in the thin film industries for protective, decorative, and functional coatings. Common examples of low cost commercial thin film products include water permeable coatings on polymer-based food packaging, decorative coatings on architectural glass, low emissivity thermal control coatings on residential and commercial glass, and scratch and anti-reflective coatings on eyewear. Adopting or modifying techniques that have been developed in these other fields has allowed a reduction in development costs for PV cell thin film deposition techniques.

Furthermore, thin film cells, particularly those employing a sunlight absorber layer of copper indium diselenide, copper indium disulfide, copper indium aluminum diselenide, or copper indium gallium diselenide, have exhibited efficiencies approaching 20%, which rivals or exceeds the efficiencies of the most efficient crystalline cells. In particular, copper indium gallium diselenide (GIGS) is stable, has low toxicity, and is truly thin film, requiring a thickness of less than two microns in a working PV cell. As a result, to date CIGS appears to have demonstrated the greatest potential for high performance, low cost thin film PV products, and thus for penetrating bulk power generation markets.

Thin film PV materials may be deposited either on rigid glass substrates, or on flexible substrates. Glass substrates are relatively inexpensive, generally have a coefficient of thermal expansion that is a relatively close match with the CIGS or other absorber layers, and allow for the use of vacuum deposition systems. However, such rigid substrates suffer from various shortcomings, such as a need for substantial floor space for processing equipment and material storage, specialized heavy duty handling equipment, a high potential for substrate fracture, increased shipping costs due to the weight and delicacy of the glass, and difficulties in installation. As a result, the use of glass substrates is not optimal for large-volume, high-yield, commercial manufacturing of multilayer functional thin film materials such as photovoltaics.

In contrast, roll-to-roll processing of thin flexible substrates allows for the use of compact, less expensive vacuum systems, and of non-specialized equipment that already has been developed for other thin film industries. PV cells based on thin flexible substrate materials also exhibit a relatively high tolerance to rapid heating and cooling and to large thermal gradients (resulting in a low likelihood of fracture or failure during processing), require comparatively low shipping costs, and exhibit a greater ease of installation than cells based on rigid substrates.

A particular type of n-type semiconductor material that may be used in thin-film PV cells is known in the field of chemistry as a chalcogenide. A chalcogenide is a chemical compound consisting of at least one chalcogen ion and at least one more electropositive element such as a metal. Forming a thin film of chalcogenide is described in the prior art, for example, in U.S. Pat. No. 6,537,845 to McCandless et al., which is hereby incorporated into the present disclosure by reference for all purposes. However, forming chalcogenide films having a desired thickness and uniformity remains technically challenging. For example, some existing methods of chalcogenide formation involve depositing reactant solutions on stationary substrates, and methods of this type may have efficiency and speed limitations. Other existing methods may deposit reactants on a moving substrate, but typically drag the substrate over a conductive heater. This may lead to non-uniform motion of the substrate (e.g., due to friction with the heater), non-uniform heating of the substrate, and/or other issues resulting in undesirable non-uniformities in the chalcogenide buffer layer. Furthermore, holding portions of the web down onto a conductive heater (e.g., to maintain flatness while lifting the web edges for solution containment purposes) may result in localized hot spots on the web, resulting in additional non-uniformities in the substrate temperature and chalcogenide layer thickness.

SUMMARY

The present teachings disclose improved methods and apparatus for forming thin film buffer layers of chalcogenide on a substrate web through the chemical combination of a metal and chalcogen in solution form. The web and/or the solutions may be heated by one or a plurality of heating elements, allowing enhanced control over the reaction speed through fine temperature control. In some embodiments, the heating elements may heat the web substantially without physical contact between the web and the heating elements. One or more properties of the chalcogenide layer may be measured, and the temperature of the system may be adjusted in response.

DETAILED DESCRIPTION

I. Introduction

Figure 1:
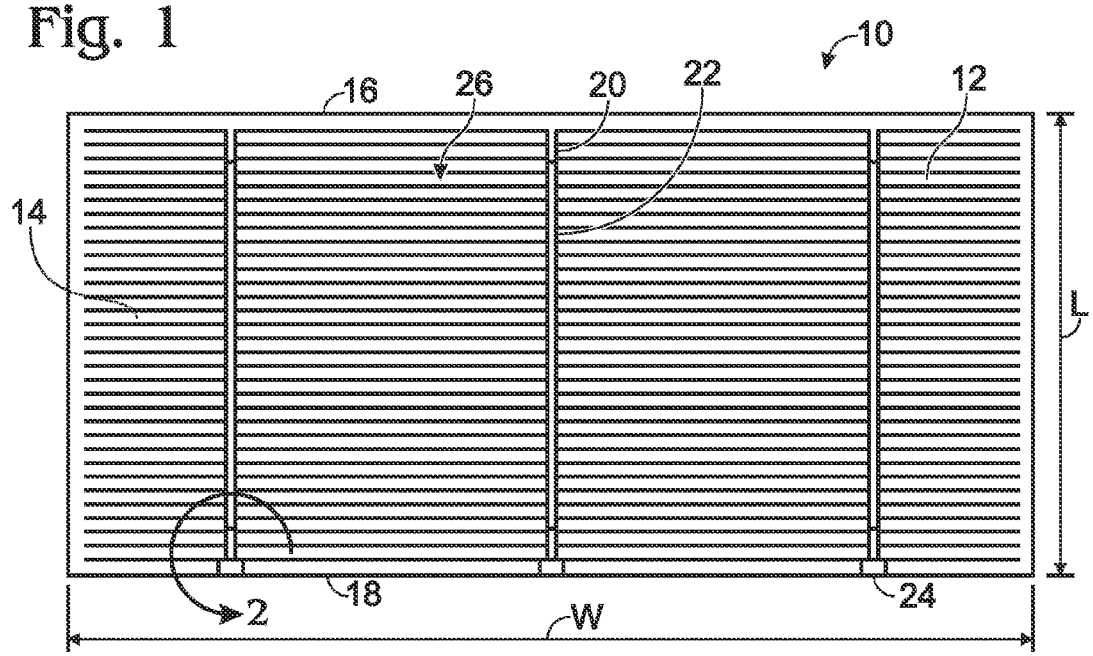
FIG. 1 is a top view of a thin film photovoltaic cell, according to aspects of the present disclosure.

Manufacture of flexible thin-film PV cells may proceed by a roll-to-roll process. As compared to rigid substrates, roll-to-roll processing of thin flexible substrates allows for the use of relatively compact, less expensive vacuum systems, and of some non-specialized equipment that already has been developed for other thin-film industries. Flexible substrate materials inherently have lower heat capacity than glass, so that the amount of energy required to elevate the temperature is minimized. They also exhibit a relatively high tolerance to rapid heating and cooling and to large thermal gradients, resulting in a low likelihood of fracture or failure during processing. Additionally, once active PV materials are deposited onto flexible substrate materials, the resulting unlaminated cells or strings of cells may be shipped to another facility for lamination and/or assembly into flexible or rigid solar modules. This strategic option both reduces the cost of shipping (lightweight flexible substrates vs. glass), and enables the creation of partner-businesses for finishing and marketing PV modules throughout the world.

One or more of the layers deposited in a thin-film PV cell typically is a "window layer(s)" that allows usable light to penetrate to the interior of the cell, and which in some cases also may serve as the n-type semiconductor material in the cell. Such a layer also may be referred to in the PV cell field as a "buffer layer." When used both as a window layer and a semiconductor, the buffer layer ideally should be both substantially transparent to light in a desired wavelength range, and also exhibit the appropriate electronic properties. The buffer layer also could consist of multiple window layers acting also as semiconductors, such as a layer of cadmium sulfide followed by a layer of cadmium-zinc sulfide. A thin-film buffer layer with desired properties may be formed through chemical reaction between one or more metals such as zinc, cadmium, lead, mercury, or any metal or combination of metals selected from groups 1b, 2b, or 3a of the Periodic Table of the Elements, and a chalcogen such as oxygen, sulfur, selenium, or tellurium. The resulting compounds are often termed chalcogenides. Suitable window or buffer layer compounds for solar devices may include, for example, cadmium sulfide, zinc sulfide, zinc selenide, cadmium zinc selenide, zinc oxide, and cadmium zinc oxide.

Historically, the formation of a thin-film buffer layer or layers often proceeds by a relatively inefficient cyclical process that includes heating the substrates in a water-containing vessel to an elevated temperature, adding and mixing in a metallic salt, and then adding and mixing in a chalcogen-containing component. After a proscribed time at a proscribed temperature, the reaction is complete, the substrates are removed, the used solution is sent to waste treatment, reactant-containing solution is applied to the web, and the vessel is cleaned for the next reaction. In addition, existing methods of applying the reactant-containing solution to the web typically result in deposition of chalcogenide over both the desired ("front" or "top") surface of the web, and also over at least a portion of the other ("back" or "bottom") surface of the web, requiring at least one cleaning step to remove the material from the back surface. This is typically accomplished with an acidic solution that must be carefully controlled and completely removed to avoid damage to the desired thin-film layers and to avoid long-term corrosion issues activated by the presence of residual acidity. A sacrificial coating or covering for the back surface of the web may also potentially be used to protect the back side from chalcogenide coverage, but such a coating requires additional cleanup and may result in excessive cost.

FIG. 1 shows a top view of a thin-film photovoltaic cell 10, in accordance with aspects of the present disclosure. Cell 10 is substantially planar, and typically rectangular as depicted in FIG. 1, although shapes other than rectangular may be more suitable for specific applications, such as for an odd-shaped rooftop or other surface. The cell has a top surface 12, a bottom surface 14 opposite the top surface, and dimensions including a length L, a width W, and a thickness. The length and width may be chosen for convenient application of the cells and/or for convenience during processing, and typically are in the range of a few centimeters (cm) to tens of cm. For example, the length may be approximately 100 millimeters (mm), and the width may be approximately 210 mm, although any other suitable dimensions may be chosen. The edges spanning the width of the cell may be characterized respectively as a leading edge 16 and a trailing edge 18. The total thickness of cell 10 depends on the particular layers chosen for the cell, and is typically dominated by the thickness of the underlying substrate of the cell. For example, a stainless steel substrate may have thickness on the order of 0.025 mm (25 microns), whereas all of the other layers of the cell may have a combined thickness on the order of 0.002 mm (2 microns) or less.

Cell 10 is created by starting with a flexible substrate, and then sequentially depositing multiple thin layers of different materials onto the substrate. This assembly may be accomplished through a roll-to-roll process whereby the substrate travels from a pay-out roll to a take-up roll, traveling through a series of deposition regions between the two rolls. The PV material then may be cut to cells of any desired size. The substrate material in a roll-to-roll process is generally thin, flexible, and can tolerate a relatively high-temperature environment. Suitable materials include, for example, a high temperature polymer such as polyimide, or a thin metal such as stainless steel or titanium, among others. Sequential layers typically are deposited onto the substrate in individual processing chambers by various processes such as sputtering, evaporation, vacuum deposition, chemical deposition, and/or printing. These layers may include a molybdenum (Mo) or chromium/molybdenum (Cr/Mo) back contact layer; an absorber layer of material such as copper indium diselenide, copper indium disulfide, copper indium aluminum diselenide, or copper indium gallium diselenide (GIGS); a buffer layer or layers such as a layer of cadmium sulfide (CdS); and a transparent conducting oxide (TCO) layer acting as the top electrode of the PV cell. In addition, a conductive current collection grid, usually constructed primarily from silver (Ag) or some other conductive metal, is typically applied over the TCO layer.

Although the precise thickness of each layer of a thin-film PV cell depends on the exact choice of materials and on the particular application process chosen for forming each layer, exemplary materials, thicknesses and methods of application of each layer described above are as follows, proceeding in typical order of application of each layer onto the substrate:

| Layer Description | Exemplary Material | Exemplary Thickness | Exemplary Method of Application |
|---|---|---|---|
| Substrate | Stainless steel | 25 µm | N/A (stock material) |
| Back contact | Mo | 320 nm | Sputtering |
| Absorber | CIGS | 1700 nm | Evaporation |
| Buffer | CdS | 80 nm | Chemical deposition |
| Front electrode | TCO | 250 nm | Sputtering |
| Collection grid | Ag | 40 µm | Printing |

The remainder of this disclosure focuses on various methods and apparatus for forming chalcogenide buffer layer(s).

II. Heating Mechanism

This section describes methods and apparatus for transporting a web of substrate material through a deposition region, and for heating the deposition region substantially uniformly to promote chemical reaction between various reactant solutions that include chemical components of a thin film buffer and/or window layer within a desired region of the web.

Figure 2:
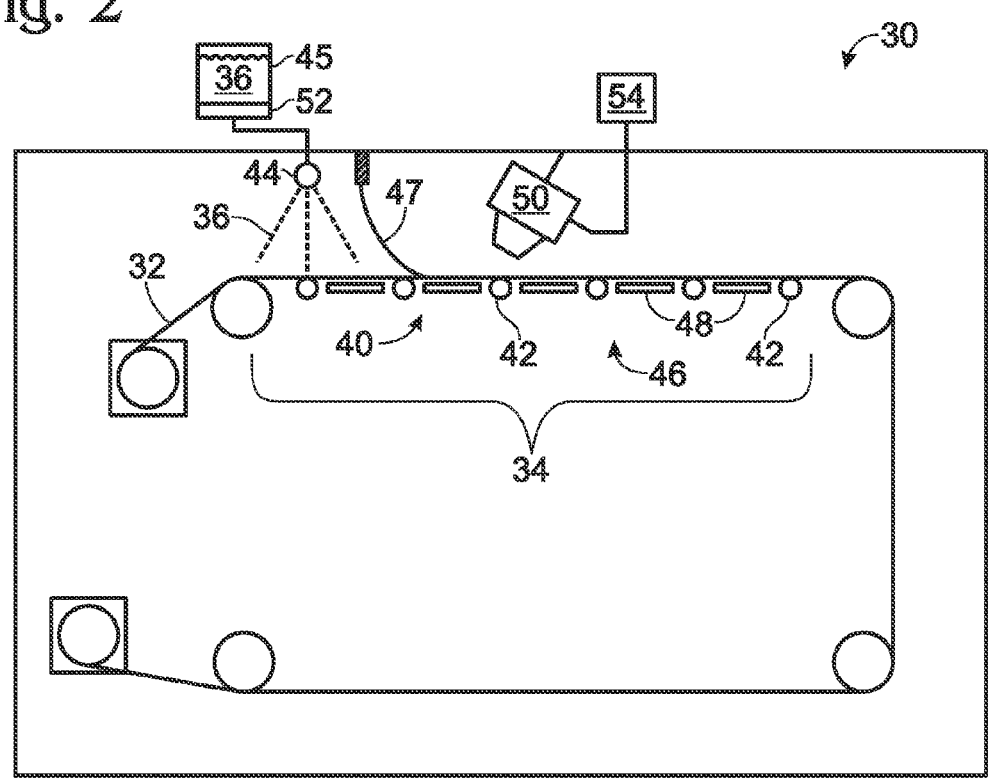
FIG. 2 is a schematic side view of an apparatus for forming a thin-film layer on a substrate web.

According to aspects of the present disclosure, a buffer layer may be applied to the underlying PV cell layers (typically a base substrate layer, a back contact layer, and an absorber layer) via a chemical deposition process. It should be understood that the terms "substrate," "substrate web" and "web" as used herein may refer to the base substrate (e.g., stainless steel) layer plus any such previously deposited underlying PV cell layers. As shown in FIG. 2, the process involves an apparatus 30 for transporting a web 32 of thin film substrate material through a deposition region 34, and dispensing one or more reactant solutions 36 onto the top surface of the web within the deposition region. To react and form a suitable chalcogenide, the reactant solution(s) should contain, at a minimum, at least one metal and at least one chalcogen.

Suitable metal-containing solutions may contain lead, and/or any group 1b, 2b, or 3a metal from the periodic table of the elements, such as a metal selected from the group consisting of copper, silver, gold, zinc, cadmium, mercury, lead, boron, aluminum, gallium, indium, and thallium. For buffer layers, the typical metals, which include zinc, cadmium, lead, and mercury, often are prepared as a salt such as a sulfate, a chloride, a nitrate, an acetate, or some suitable variant. For example, cadmium sulfate may be an appropriate metallic salt.

Suitable chalcogen-containing solutions may contain a chalcogen such as oxygen, sulfur, selenium, or tellurium, typically prepared as a reagent compound solution such as urea (an example of an oxygen-containing reagent) or thiourea (an example of a sulfur-containing reagent). In addition, the reactant solution(s) typically will contain a chemical complexant such as ammonia or ammonium hydroxide, and deionized water (DI). The metal, chalcogen, complexant, and water each may be applied to web as a separate solution, or may be combined in various ways to result in application of as few as a single solution onto the web surface.

Although the system depicted in FIG. 2 transports the web linearly and in a direction corresponding to the longitudinal dimension of the web, the present teachings also contemplate alternative methods of depositing a thin film buffer layer. These alternatives include, for example, solution application onto a concave or convex web disposed on the inside or outside of a drum-like structure, and horizontal web transport using one or a plurality of weirs (such as containers, plates, or rollers) held to a "controlled-drainage" distance from the web to hold the chalcogenide reactant solutions against the web for a suitable reaction period.

Apparatus 30 includes a transport mechanism, generally indicated at 40, for conveying a continuous flexible web of substrate material through the deposition region in the longitudinal direction. Transport mechanism 40 may take various forms, such as one or more continuous belts that may convey the web while supporting it either from above or below, or a series of rollers upon which the web rests and is conveyed. FIG. 2 depicts a transport mechanism that includes a plurality of synchronized transport rollers 42. Rollers 42 may be evenly spaced, as shown in FIG. 2, or they may be unevenly spaced to accommodate other desired elements of the apparatus. To ensure that the web is transported through the deposition region at a uniform speed along its length, rollers 42 may be synchronized by any suitable method. For example, the rollers all may be driven by a single rotating shaft, with each roller linked to the common shaft. The rollers may be linked to the shaft by a standard gear/screw linking mechanism (not shown) or by any other linking mechanism. In an alternative embodiment, the support rollers may not rotate at all, but rather may be stationary, precision leveled cross pieces.

Each (or just some) of rollers 42 may include a vertical adjustment to allow them to be leveled to a desired precision. Alternatively, rather than always remaining leveled, one or more of rollers 42 may be adjusted to slightly different vertical positions, in which case the rollers may be viewed as a slope adjustment mechanism configured to adjust the longitudinal slope of the substrate web within at least a portion of the solution deposition region. Adjusting the slope of the web in this manner alters the flow rate of solution over the corresponding portion of the web, which affects the rate of chalcogenide formation and thus the thickness of the chalcogenide layer formed by the apparatus. The slope adjustment mechanism may be preset to give the web a predetermined slope in each portion of the deposition region, or it may be used to adjust the chalcogenide deposition rate during operation of the apparatus, for instance in response to thickness measurements made during operation.

As depicted in FIG. 2, the metal-containing solution and the chalcogen-containing solution, which may be separately dispensed or combined into a single solution prior to reaching the surface of the web, may be applied (or dispensed) onto the web by one or more solution dispensers 44. These dispensers may, for example, be in fluid communication with one or more associated supply vessels 45 or other solution sources. Additional solution dispensers, not shown, may be configured to dispense additional solutions such as ammonium hydroxide and/or deionized water, or alternatively, the ammonium hydroxide and/or deionized water may be combined with one or both of the other reactant solutions prior to being dispensed. The dispensed solutions are collectively denoted by reference number 36 in FIG. 2, but it should be understood that this may represent two or more separately dispensed solutions. The solution dispenser(s) may be disposed in any suitable location, such as above the web at longitudinal positions corresponding to the desired locations for applying the associated solutions. The dispensers may have any suitable construction allowing application of solution in a sufficiently uniform manner across the transverse dimension of the web and at a desired flow rate.

In some instances, a complexant such as ammonium hydroxide ($NH_4OH$) may be dispensed separately from the metal-containing and chalcogen-containing solutions, at a suitable longitudinal position within the deposition region. Alternatively, a complexant such as ammonia ($NH_3$) may be dispensed onto the web as a gas. If dispensed as a gas, the ammonia may be dispensed through a dispenser such as those used for dispensing the liquid reactants, or it may be dispensed through a gas diffuser disposed near the surface of the substrate web. The gaseous complexant may in this manner be dispensed to diffuse over the top of any previously dispensed reactant solutions, to trigger the chalcogenide-forming reaction at a desired time and location on the web.

To facilitate uniform formation of a buffer layer, the metal-containing solution and/or the chalcogen-containing solution may be distributed across a transverse dimension D of web 32. Various methods of distributing solution may be utilized, such as passing the solution on the web under a solution spreader of some sort. One type of suitable solution spreader is a sheet of polymer film 47, constructed from a material such as polyethylene terephthalate (PET), and disposed substantially across transverse dimension D of the web. As indicated in FIG. 2, polymer film solution spreader 47 may be suspended from a position above the substrate web, to hang down toward the surface of the web and distribute a solution or a combination of solutions disposed on the web. Another method for improved dispersion and uniformity may be the use of a wetting agent, which may either be added to one or more of the solutions to be dispersed, or applied to the web prior to application of one or more of the solutions.

Because the chalcogenide-forming chemical reaction between a metal-containing solution and a chalcogen-containing solution typically requires a minimum temperature for a suitable reaction rate, one or more heaters may be provided to supply heat to the substrate web and/or to the solutions. For example, a heating mechanism, generally indicated at 46, may be configured to heat the web substantially uniformly in the deposition region. Web heating mechanism 46 may, for example, include a plurality of discrete heater blocks 48 disposed below the web. Alternatively, the web heating mechanism may be disposed above the web and/or may include a continuous heater block that extends along the length of the deposition region (not shown). In the case of discrete heater blocks, a relatively large number may be used, to allow for relatively fine control of temperature along the deposition region, as described in more detail below. For example, up to fifteen or more discrete heater sections or zones may be used.

Discrete heater blocks 48 typically are constructed substantially from a relatively high conductivity material, such as a material having thermal conductivity greater than 100 watts per meter per degree Kelvin (W/m K). This may, for example, decrease the response time of the heater blocks to a heat source, resulting in the ability to control the web temperature relatively quickly. Furthermore, the use of high conductivity materials may allow each heater block to attain a relatively uniform temperature quickly, even if the heat source for the block does not uniformly distribute heat to the block. Suitable high conductivity materials may include, among others, metals such as silver, copper and aluminum, various metal alloys, and nonmetallic or partially metallic materials having sufficiently high conductivity to promote a relatively rapid temperature response. Selection of suitable materials for the heater block(s) also may be dependent on compatibility with the chemistry being utilized in formation of the buffer layer, for example to avoid an unwanted reaction between the heater block material and any buffer layer reactants that might come into contact with the heating mechanism.

Figure 3:
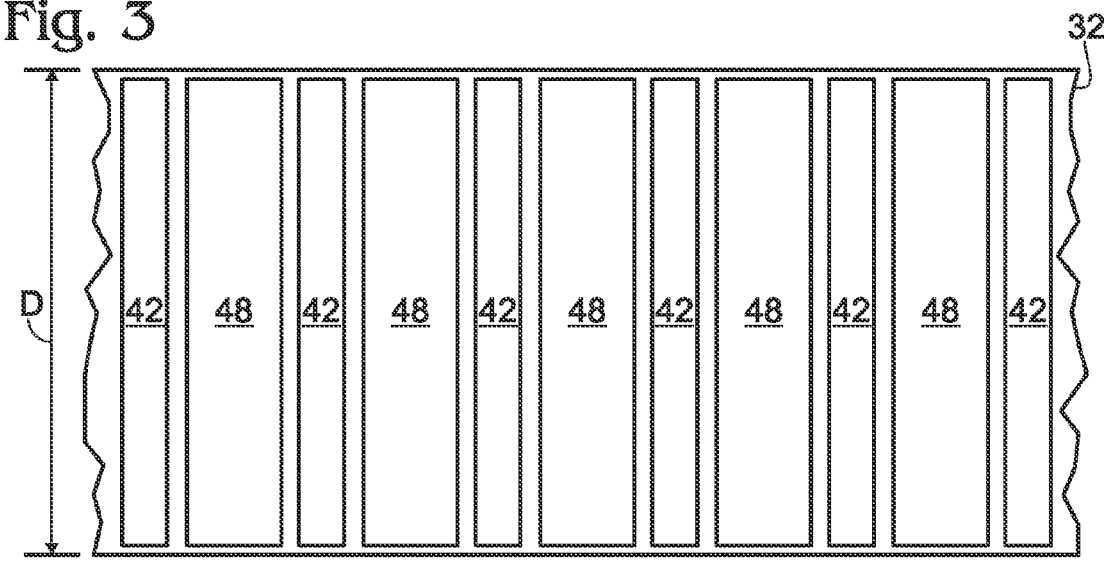
FIG. 3 is a bottom view showing a portion of a substrate web including underlying heaters and rollers.

Discrete heater blocks 48 may be disposed in any convenient location in proximity to the web. For example, they may be disposed below the web and between adjacent pairs of rollers 42. In other words, as depicted in FIG. 3, which shows a bottom view of rollers 42 and blocks 48, the heater blocks and transport rollers may be disposed longitudinally under the web in an alternating arrangement. Also as depicted in FIG. 3, heater blocks 48 may extend substantially across the transverse dimension D of the web, to heat the web substantially uniformly across its transverse width. In addition, in some embodiments the heater blocks may be disposed in close proximity to, but out of physical contact with the web, to provide heat to the web substantially nonconductively, i.e. primarily through radiation and/or convection. For example, rather than physically contacting the web, each heater block instead may be disposed within approximately 5 millimeters of the bottom surface of the web, and separation distances of 3 or 4 millimeters, or even smaller, may be suitable. In addition, other radiant heaters may be suitable that operate at distances substantially more than 5 millimeters from the web, and various convective heaters, such as a heated air knife, may be used alternatively or in addition to various types of radiant heaters. Suitable radiant heaters include both medium temperature radiant heaters located close to the web and high temperature radiant heaters (e.g. cal rods or various forms of filament heaters) located at a relatively greater distance from the web.

Locating the heating mechanism—whether in the form of discrete heater blocks or in some other form—below rather than above the web may have various advantages. For example, convection currents may be produced by heating from the bottom, and also by evaporative cooling due to the evaporation of various solution components dispensed onto the top surface of the web, such as ammonia and water. In the absence of heating elements above the web, these convection currents are able to form more readily near the top surface of the web, and this may improve temperature uniformity across the surface of the web, promoting more uniform chemical growth of a chalcogenide buffer layer. In addition, in embodiments where the heating elements are disposed below the web and the reactant solutions are contained to the top surface of the web, potential maintenance issues due to the undesirable formation of thin films on the heating elements themselves may be avoided. Avoiding such undesirable thin film growth on the heating elements may be more difficult if the heating mechanism is located partially or entirely above the web, so that it is not separated from the buffer layer reactants by the web itself.

Each of heater blocks 48 may have an individually controllable temperature, so that the temperature of various zones of the deposition region of the PV web may be controlled independently. This may be advantageous, for example, in controlling the reaction rate of the buffer layer reactants along the length of the web. More specifically, the greater temperature control offered by a plurality of independently controllable heating blocks may allow adjustments to the average web temperature at a given distance along the web in the deposition and reaction areas in response to a measured property of the web, such as the thickness or uniformity of the chalcogenide buffer layer formed on the web surface. Such properties may be measured directly or indirectly, for instance using one or more measuring devices 50 including elements such as one or more light sources, cameras, temperature sensors, and/or interferometers. Upon measuring a deviation in thickness or uniformity from desired parameters, the temperature in various regions of the web may be adjusted to speed up or slow down the chalcogenide-producing reaction rate or to react more or less of the available reactants within a particular portion of the deposition region, until the desired properties of the thin film buffer layer are restored or desirably adjusted to the extent possible. In addition to independently adjustable overall temperatures, heaters 48 may have adjustable edge-to-center temperature profiles for improved heating uniformity. Alternatively or in addition to heaters 48, various trim heaters (not shown) may be used to compensate for heat loss, thus optimizing temperature uniformity.

Aside from the heating mechanism described above, the reactant solutions that are dispensed to form a chalcogenide buffer layer also may be preheated to any desired degree, for example by a solution preheater 52 depicted in FIG. 2, which may be disposed, e.g., under or otherwise in proximity to supply vessel 45. In some embodiments, this preheating may in fact be the primary heating mechanism, and may be used to bring the web up to a desired reaction temperature. This is possible because the thickness and/or specific heat of a fluid layer of reactant solutions dispensed onto the web may be substantially greater than the thickness and/or specific heat of the underlying web, resulting in a commensurately greater heat capacity of the reactant solutions than of the web. For example, the thickness of the reactant fluid layer may be approximately 2-4 millimeters, whereas the thickness of the underlying web may be only approximately 0.025 millimeters (25 microns). Furthermore, the specific heat of the reactant solutions is expected to be on the order of 4000 J/kg ° K. (similar to the specific heat of water), whereas the specific heat of the underlying web is expected to be on the order of only 500 J/kg ° K. (similar to the specific heat of stainless steel). As a result of one or both of these factors, the temperature of the applied reactant solutions largely determines the temperature of the substrate web in the deposition region, and heating mechanism 46 may be used primarily to maintain and/or make minor adjustments to a desired reaction temperature rather than actually to provide the heat of chalcogenide reaction to a significant degree.

A specific example of the consequences of the varying heat capacities of the web and the reactant solutions is the following. A reactant solution may be preheated to a desired temperature that is slightly greater than the desired reaction temperature within the deposition region of the web, such as to a temperature of 55-75 degrees Celsius. The web may be heated by heating mechanism 46 and/or by the surrounding operating environment such that in the absence of any reactant solutions, the web would attain a temperature lower than the desired reaction temperature, such as a temperature of 25-45 degrees Celsius. The preheated reactant solution, which in this example has a significantly higher temperature than the web, then may be applied to the web, resulting in a slight decrease in solution temperature and a substantial increase in web temperature, with an equilibrium temperature at or near the desired reaction temperature. This desired reaction temperature then may be maintained, at a desired average profile throughout the deposition region, by heating mechanism 46, which supplies substantially uniform heat to balance evaporative, convective and other heat losses.

Other, similar exemplary heating processes are possible in which additional reactant solutions are preheated to various degrees and then dispensed onto the web. In each such alternative embodiment, the combination of preheated solution(s) and heating mechanism 46 is configured to result in a desired reaction temperature within the deposition region of the web. Furthermore, in some embodiments, solution application may be configured such that little or no heating of the web is required, aside from heating the web with the applied reactant solution(s). That is, if the metal-containing solution and/or the chalcogen-containing solution are sufficiently hot, then the mere combination of the solutions can rapidly start the chalcogenide reaction. If heat losses are sufficiently controlled, the reaction can continue to substantial completion without any additional heating of the solutions or the web, or with only enough additional heating to maintain a desired reaction temperature.

As noted previously, substantially providing the heat of chalcogenide reaction with the reactant solutions may be accomplished if one or both of the metal-containing solution and the chalcogen-containing solution, which are schematically depicted as solution 36 in FIG. 2, are preheated, for example by heaters such as preheater 52 depicted in FIG. 2. In some cases, both solutions may be preheated to a temperature in excess of the web temperature, and their temperatures upon application to the web may be monitored by one or more infrared sensors to ensure a desired initial reaction temperature. In such embodiments, the temperature of the web may be monitored at any or all locations both prior and subsequent to application of each solution. In cases where the solutions are dispensed separately this may, for example, allow the second solution dispensed to be preheated to a temperature greater than the temperature of the web after application of the first solution dispensed. It should be understood that "preheating" simply refers to heating that occurs before a solution is dispensed onto the web. Accordingly, preheating need not occur at the solution supply location, but may be performed in-line, in some cases even by the solution dispenser or applicator. Preheating a solution closer to dispensing it onto the web may result in less heat loss as the solution moves from storage toward the web.

Measuring device 50 may be in communication with a processor 54 configured to determine the thickness of the thin film buffer layer from the image data captured by the measuring device, and to control heat supplied by at least a portion of the heating mechanism based on the measured thickness. For example, if measuring device 50 is a camera, processor 54 may analyze the color, reflectivity, uniformity, or any other suitable property of the thin film chalcogenide layer formed on the web and captured by the camera as image data. Based on the measured property of the chalcogenide layer, processor 54 may send a signal to one or more of heater blocks 48 and/or to pre-heater 52, to cause a change in the amount of heat supplied to the reactant solution(s) and/or to a desired portion of the substrate web within the deposition region. Because the rate of chalcogenide reaction depends on temperature, this feedback can be used to adjust and make corrections to the properties of the chalcogenide layer during operation of apparatus 30.

Figure 4:
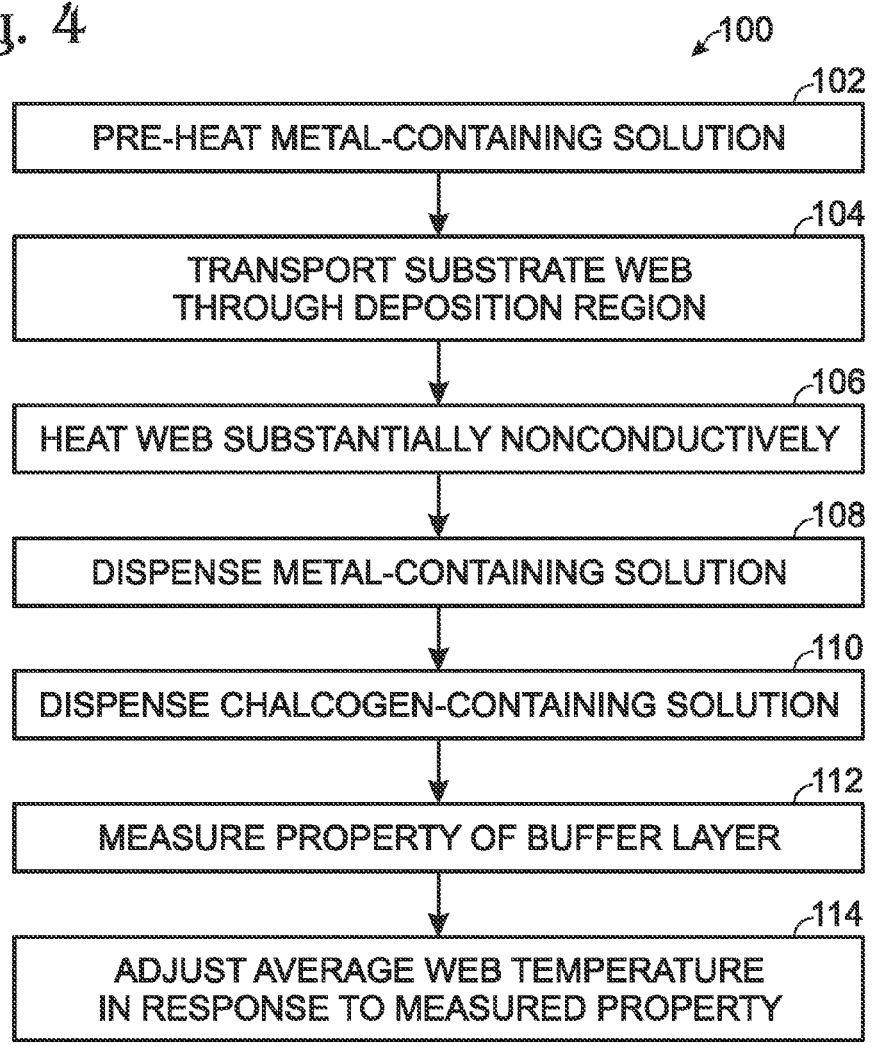
FIG. 4 is a flow chart depicting a method of depositing a thin film chalcogenide buffer layer onto a flexible substrate.

FIG. 4 is a flowchart depicting a method, generally indicated at 100, of depositing a thin film chalcogenide buffer layer onto a flexible substrate web according to aspects of the present teachings. At step 102, a metal-containing solution is pre-heated to a temperature greater than the average substrate web temperature. The metal-containing solution may contain, for example, a metal chosen from the group consisting of copper, silver, gold, zinc, cadmium, mercury, lead, boron, aluminum, gallium, indium, and thallium. The metal-containing solution may be pre-heated to any suitable temperature for chalcogenide formation, such as to a temperature in the range from 55-75 degrees Celsius. The average web temperature prior to deposition of the metal-containing solution may be substantially less than this, such as 25-45 degrees Celsius, which may be similar to room temperature or to the operating temperature of the associated apparatus. Upon deposition of the metal-containing solution onto the web, the web will relatively quickly approach the temperature of the applied solution, due to the much greater heat capacity of the solution relative to the substrate.

At step 104, a web of thin-film substrate material is transported through a deposition region in a longitudinal direction. As described above, the substrate material may include a base substrate, such as a thin sheet of stainless steel, upon which one or more thin-film layers have already been deposited. For example, a back contact layer constructed from a material such as molybdenum, and a p-type absorber layer constructed from a material such as CIGS, may already have been deposited on the base substrate. It should be understood that the substrate web may include these and/or other pre-deposited layers when it is transported through the chalcogenide deposition region. The web will generally be transported in a roll-to-roll or other similar process, in which case the longitudinal direction will be the direction of travel between the pay-out roll and the take-up roll.

Transporting the web may include passing the web over a plurality of transport rollers, such as rollers 42 depicted in FIG. 2, although it should be appreciated that many other transport mechanisms are possible and within the scope of the present teachings. The transport rollers may be synchronized with each other to ensure uniform motion of the substrate web, and heater blocks may be disposed between adjacent pairs of rollers, also as depicted in FIG. 2. The heater blocks may be used to carry out a portion of heating step 106 as described below.

At step 106, the substrate web is heated substantially nonconductively to maintain an average web temperature. The term "nonconductive" as used in the present teachings is meant merely to exclude cases in which the substrate web is placed in direct physical contact with a heater, for instance by being dragged over or under the heater. Nonconductive heating therefore includes heating by both convection and radiation. It should also be understood that the phrase "average web temperature" does not imply a uniform web temperature, because as described previously, portions of the web contacted by one or more reactant solutions such as a metal-containing solution may have a significantly different temperature than portions of the web that have not been contacted by any reactant solutions. However, nonconductive heating may be used to maintain a first desired temperature in those regions of the web that have not been contacted with reactant solutions, and/or one or more other desired temperatures in regions of the web upon which solutions have been dispensed. Nonconductive heating may be accomplished through the use of a heating mechanism disposed out of physical contact with the web, such as by irradiating the web with infrared radiation emitted from one or more heater blocks disposed in proximity to a lower surface of the web.

Various measures may be taken to avoid substantial changes in heater block emissivity in cases where reactant solutions reach the heater blocks, for example when solution passes over the lateral edges of the web due to imperfect containment upon the top surface. One such measure is to apply to the heater blocks a coating having emissivity substantially similar to the emissivity of the chalcogenide buffer layer deposited on the top surface of the web. In this case, even when chalcogenide forms on the heaters, the heater blocks will radiate energy toward the web at substantially the same rate. Another measure is to apply to the heater blocks a coating configured to deter or repel deposition of chalcogenide. The coating may be simply a hydrophobic coating that sheds reactant solutions reaching the heaters before they have time to react and form chalcogenide, or the coating may be specifically designed to prevent chalcogenide formation by chemically reacting with one or more of the chalcogenide reactants. The coating also may be configured to bond only weakly with chalcogenide, so that the heaters may be quickly and easily cleaned to remove any excess chalcogenide that forms on the blocks. As a third measure, the heaters may include removable lids, which can either be cleaned or replaced at desired intervals.

At step 108 of method 100, the metal-containing solution is dispensed onto the top surface of the web. The solution may be dispensed by a dispenser similar to dispenser 44 described previously, but it should be appreciated that any suitable means of dispensing a solution falls within the scope of the present teachings. At step 110, a chalcogen-containing solution is dispensed onto the top surface of the web. This solution contains a chalcogen selected from the group consisting of oxygen, sulfur, selenium and tellurium, and which is known to react with the metal in the metal-containing solution to form a chalcogenide with desired optical and/or electronic properties. One exemplary combination is for cadmium to combine with sulfur to produce cadmium sulfide, but other chalcogenides may be suitable as buffer layers and/or n-type semiconductor layers. It should be understood that the metal-containing and chalcogen-containing solutions may be dispensed by two or more separate dispensers.

At step 112 of method 100, one or more properties of a thin film chalcogenide buffer layer is measured. The measured property may include, for example, thickness of the thin film, uniformity of the thin film in the longitudinal and/or transverse dimensions, color of the thin film, rate of formation (i.e., reaction rate) of the thin film, or reflectivity of the thin film, among others. These properties may be measured with any suitable measuring device. For example, the measuring device may include a camera for capturing image data from the substrate web and relaying the images to an operator who observes the properties of the buffer layer manually. Alternatively, the camera or other sensor may relay data to a processor, which processes the data to determine a desired property of the chalcogenide film.

At step 114, the average substrate web temperature is adjusted in response to one or more of the properties measured at step 112. For example, if the thickness of the chalcogenide buffer layer is measured at step 112 and the buffer layer is found to be undesirably thin, the average web temperature may be increased to promote faster chalcogenide reaction, and if the buffer layer is found to be undesirably thick, the average web temperature may be decreased to promote slower chalcogenide reaction. In some cases, the web may be passed over a plurality of heat sources each of which has an independently controllable temperature, and the temperatures of the individual heat sources may be adjusted independently to give the substrate a desired temperature profile.

Any temperature adjustments to the substrate web will generally be quite small compared to the reaction temperature, and may be viewed as minor corrections. Even when such adjustments are made, the heat for chalcogenide reaction may be supplied substantially by the pre-heated reactant solution(s). In some instances, a measurement may determine that the initial heat supplied by the reactants is either insufficient or too great, in which case the temperature of the metal-containing and/or the chalcogen-containing solution may be adjusted before the solutions are dispensed onto the web, which also has the effect of adjusting the average web temperature. Whether temperature adjustments are made directly to the web or to one or more of the reactant solutions prior to dispensing the solutions onto the web, the temperature adjustments may be made either manually by an operator or, in cases where a processor is used to receive and process data from a measuring device, the adjustments may be made automatically in the form of commands sent to one or more of the heaters by the processor.

It should be appreciated that in method 100 depicted in FIG. 4, not every step is required according to the present teachings. More specifically, a minimal method involves only transporting a substrate web through a deposition region, heating the web substantially nonconductively to maintain an average web temperature, and dispensing metal-containing and chalcogen-containing solutions onto the web to form a chalcogenide buffer layer. The remaining steps may be applied in particular embodiments, to deposit chalcogenide layers having various desired attributes.

The disclosure set forth above may encompass multiple distinct inventions with independent utility. Although each of these inventions has been disclosed in its preferred form(s), the specific embodiments thereof as disclosed and illustrated herein are not to be considered in a limiting sense, because numerous variations are possible. The subject matter of the inventions includes all novel and nonobvious combinations and subcombinations of the various elements, features, functions, and/or properties disclosed herein. The following claims particularly point out certain combinations and subcombinations regarded as novel and nonobvious. Inventions embodied in other combinations and subcombinations of features, functions, elements, and/or properties may be claimed in applications claiming priority from this or a related application. Such claims, whether directed to a different invention or to the same invention, and whether broader, narrower, equal, or different in scope to the original numbered paragraphs that follow, also are regarded as included within the subject matter of the inventions of the present disclosure.

We claim:

1. A method of depositing a thin film chalcogenide buffer layer onto a flexible substrate, comprising:
   transporting a web of thin film substrate material through a deposition region;
   heating the web substantially nonconductively to maintain an average web temperature;
   dispensing onto a top surface of the web a first solution containing a metal chosen from the group consisting of copper, silver, gold, zinc, cadmium, mercury, lead, boron, aluminum, gallium, indium, and thallium;
   dispensing onto the top surface of the web a second solution containing a chalcogen chosen from the group consisting of oxygen, sulfur, selenium, and tellurium;
   measuring at least one property of a thin film formed through combination of the metal and the chalcogen, wherein the property is selected from the group consisting of thickness of the thin film and uniformity of the thin film; and
   adjusting the average web temperature in response to the at least one measured property.

2. The method of claim 1, wherein the measured property is thickness of the thin film.

3. The method of claim 1, wherein the measured property is uniformity of the thin film.

4. The method of claim 1, further comprising pre-heating the first solution to a temperature greater than the average web temperature prior to dispensing the first solution onto the web.

5. The method of claim 1, wherein heating the web includes irradiating the web with infrared radiation emitted from a plurality of heater blocks.

6. The method of claim 5, wherein at least one of the heater blocks includes a coating having emissivity substantially similar to the emissivity of the deposited chalcogenide buffer layer.

7. The method of claim 5, wherein at least one of the heater blocks includes a coating configured to deter deposition of chalcogenide.

8. The method of claim 5, wherein at least one of the heater blocks includes a removable lid.

9. The method of claim 1, wherein heating the web includes passing the web over a plurality of heat sources, each heat source having an independently controllable temperature, and wherein adjusting the average web temperature includes adjusting the temperature of at least one of the heat sources.

10. A method of depositing a thin film chalcogenide buffer layer onto a flexible substrate, comprising:
    transporting a web of thin film substrate material through a deposition region;
    heating the web substantially nonconductively to maintain an average web temperature;
    dispensing onto a top surface of the web a first solution containing a metal chosen from the group consisting of copper, silver, gold, zinc, cadmium, mercury, lead, boron, aluminum, gallium, indium, and thallium;
    dispensing onto the top surface of the web a second solution containing a chalcogen chosen from the group consisting of oxygen, sulfur, selenium, and tellurium;
    measuring a reaction rate of the metal and the chalcogen; and
    adjusting the average web temperature in response to the measured reaction rate.

11. The method of claim 10, further comprising pre-heating the first solution to a temperature greater than the average web temperature prior to dispensing the first solution onto the web.

12. The method of claim 10, wherein heating the web includes irradiating the web with infrared radiation emitted from a plurality of heater blocks.

13. The method of claim 12, wherein at least one of the heater blocks includes a coating having emissivity substantially similar to the emissivity of the deposited chalcogenide buffer layer.

14. The method of claim 12, wherein at least one of the heater blocks includes a coating configured to deter deposition of chalcogenide.

15. The method of claim 12, wherein at least one of the heater blocks includes a removable lid.

16. The method of claim 10, wherein heating the web includes passing the web over a plurality of heat sources, each heat source having an independently controllable temperature, and wherein adjusting the average web temperature includes adjusting the temperature of at least one of the heat sources.

* * * * *